(12) United States Patent
Shanjani (10) Patent No.: US 8,320,841 B2
(45) Date of Patent: Nov. 27, 2012

(54) ACTIVE POWER METER

(75) Inventor: Payman Hosseinzadeh Shanjani, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 1553 days.

(21) Appl. No.: 11/768,936

(22) Filed: Jun. 27, 2007

(65) Prior Publication Data

US 2009/0004976 A1    Jan. 1, 2009

(51) Int. Cl.
*H04B 1/38* (2006.01)
(52) U.S. Cl. ........................................................ 455/73
(58) Field of Classification Search .................. 455/82, 455/83, 78, 79
See application file for complete search history.

(56) References Cited

U.S. PATENT DOCUMENTS

| 5,752,171 | A  * | 5/1998 | Akiya | 455/126 |
| 6,836,646 | B2 * | 12/2004 | Nagasaka | 455/126 |
| 6,917,245 | B2 * | 7/2005 | Dupuis et al. | 330/279 |
| 7,483,678 | B2 * | 1/2009 | Rozenblit et al. | 455/73 |
| 7,496,339 | B2 * | 2/2009 | Balteanu et al. | 455/260 |
| 7,706,762 | B2 * | 4/2010 | Kirisawa | 455/127.2 |
| 8,027,648 | B2 * | 9/2011 | Brady et al. | 455/83 |
| 2007/0184795 | A1 * | 8/2007 | Drogi et al. | 455/127.1 |

* cited by examiner

*Primary Examiner* — Duc Nguyen
*Assistant Examiner* — Ankur Jain
(74) *Attorney, Agent, or Firm* — Garlick & Markison; Bruce E. Garlick (57) ABSTRACT

An integrated circuit radio transceiver and method therefore include circuitry for generating and power amplifying an outgoing RF signal to produce a power amplified outgoing signal, conducting the power amplified outgoing signal down a transmission path that is disposed substantially parallel to a directional coupler formed on a metallization layer of the integrated circuit, producing a sensed signal level sensed in the directional coupler to a power detector and determining the forward output power based upon the sensed signal level.

26 Claims, 8 Drawing Sheets

FIG. 3
MIMO transceiver

ACTIVE POWER METER

BACKGROUND

1. Technical Field

The present invention relates to wireless communications and, more particularly, to circuitry for wireless communications.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bi-polar circuitry, allowing for large signal swings and linear transmitter component behavior. Therefore, many legacy baseband processors employ analog interfaces that communicate analog signals to and from the radio processor.

Designs for wireless transceivers are continuously evolving to improve performance. Desired performance improvements include improvements in signal quality, power consumption (efficiency), and size and weight reductions. As such, there is a continuing need for inventions to the design and implementation of wireless transceivers that improve at least one of the signal quality, power consumption, weight or size of the device.

Typically, a need exists for accurately measuring forward output power. Typically, a discreet directional coupler is used to measure the forward power transferred from the transmitter to the antennal. Generally, a small part of the electromagnetic energy of the output of the transmitter is sensed by the directional coupler which typically comprises a long transmission line or micro-strip. Such a coupler is often bulky and consumes substantial IC real estate. As such, an approach for accurately measuring forward output power that is more IC real estate efficient would generally satisfy the goal of improving the weight or size of a transceiver device.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
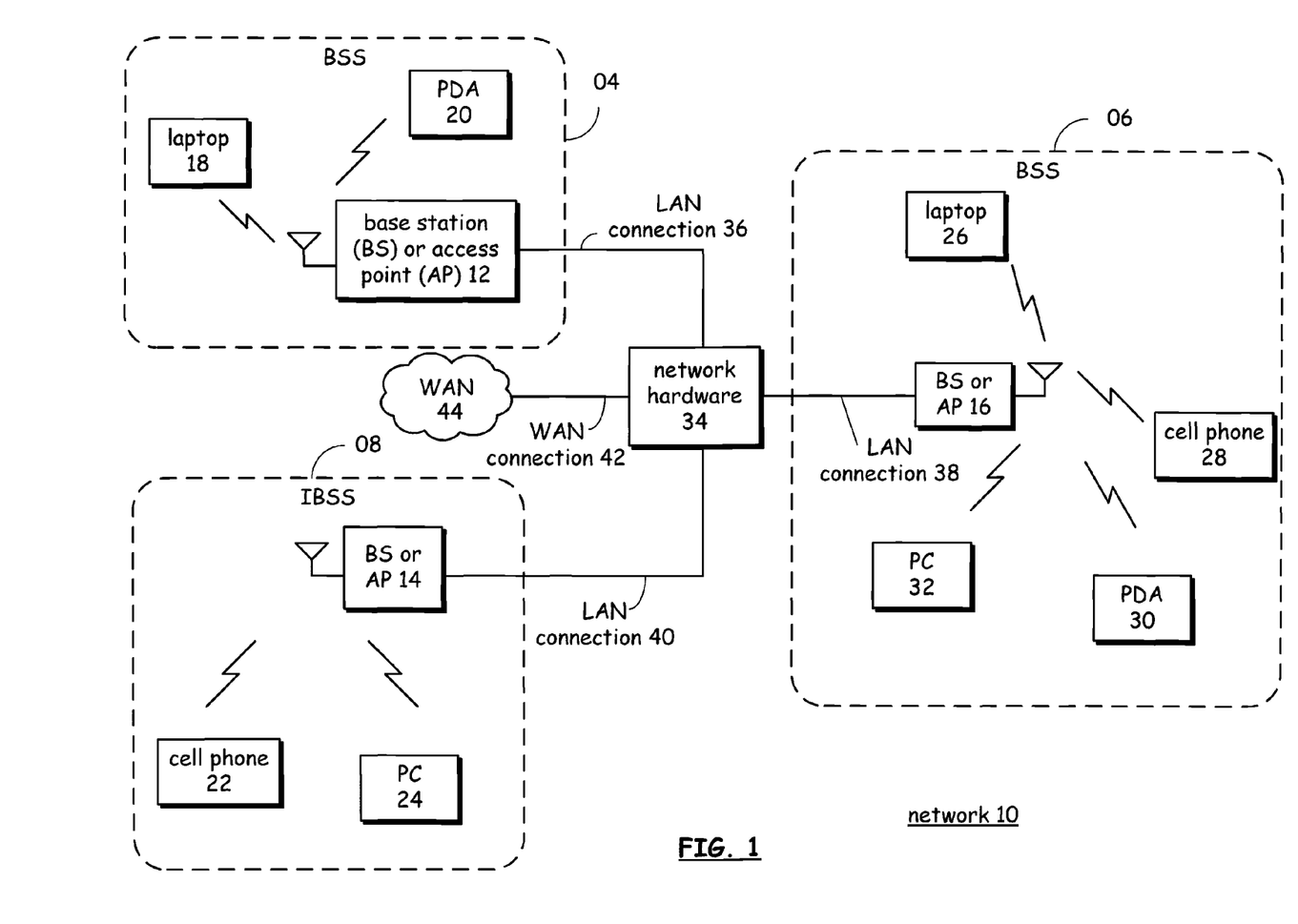
FIG. 1 is a schematic block diagram illustrating a wireless communication device that includes a host device and an associated radio.

FIG. 1 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-10.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
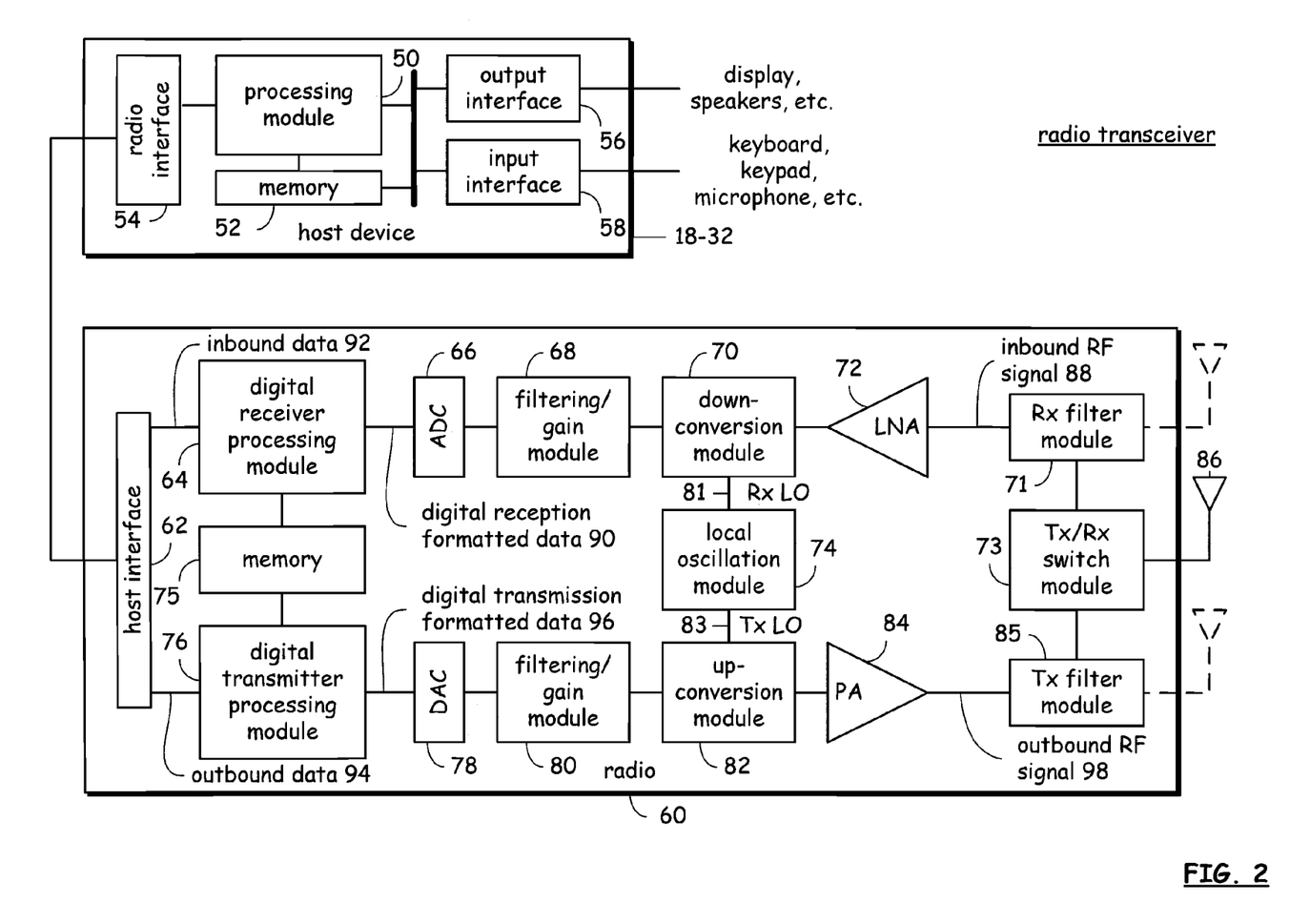
FIG. 2 is a schematic block diagram illustrating a wireless communication host device and an associated radio.

FIG. 2 is a schematic block diagram illustrating a wireless communication host device 18-32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard or protocol (e.g., IEEE 802.11(a), IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 2 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current mirror devices formed within the one or more integrated circuits.

Local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 3:
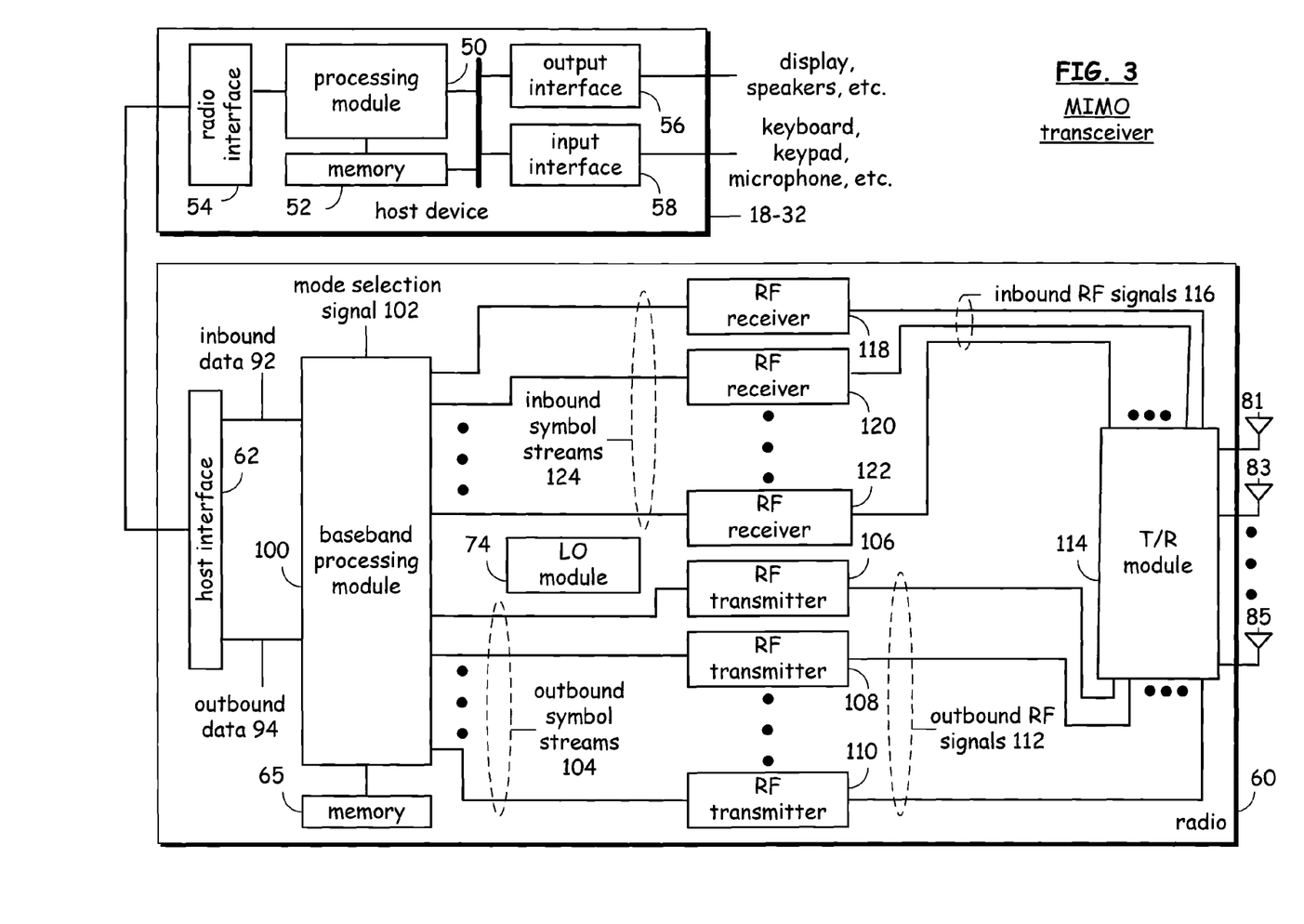
FIG. 3 is a schematic block diagram illustrating a wireless communication host device and an associated radio having multiple transmit and receive paths according to one embodiment of the invention.

FIG. 3 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 3 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 4:
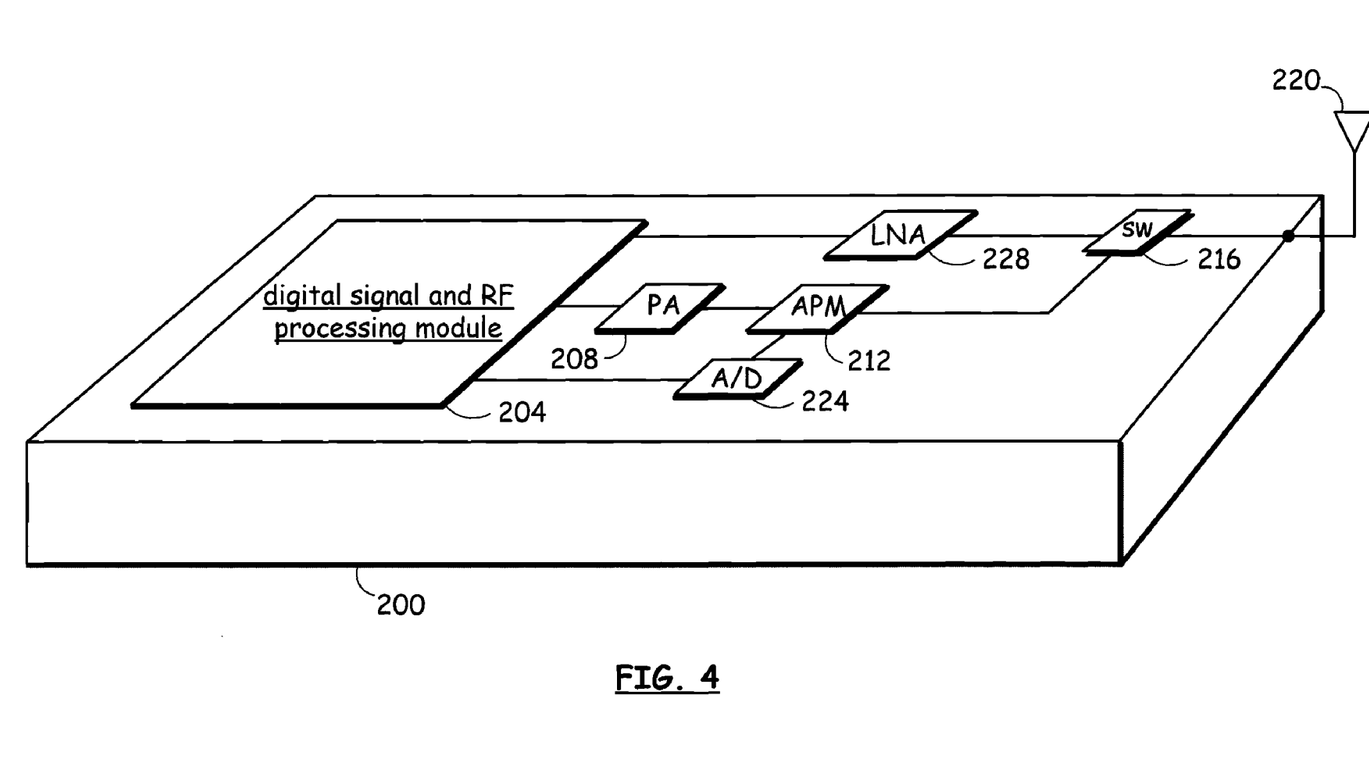
FIG. 4 is a functional block diagram of an integrated circuit radio transceiver comprising a directional coupler according to one embodiment of the invention.

FIG. 4 is a functional block diagram of an integrated circuit transceiver according to one embodiment of the present invention. An integrated circuit transceiver 200 includes a digital signal and RF processing module 204 that is operable to produce an outgoing RF signal to a power amplifier 208. Power amplifier 208, in the described embodiment of the invention, is a three-stage power amplifier. Any known configuration for a power amplifier may be used herein so long as such configuration is adaptable for implementation on a single integrated circuit radio transceiver chip.

Power amplifier 208 subsequently produces an amplified RF signal for transmission from an antennal. In the described embodiment of the invention, the amplified RF is conducted through an active power meter to 212 which is operable to produce an analog signal that reflects a forward output power level of the signal being produced of the amplified RF being produced by power amplifier 208. The amplified RF output of active power meter 212 is then produced to a transmit/receive switch 216 which, in the transmit mode of operation, produces the amplified RF to antenna 220.

Active power meter 212 further produces the continuous waveform signal that represents the forward output power to an analog-to-digital converter module 224, which produces a digital representation of the forward output power back to digital signal and RF processing module 204. The foregoing discussion relates to a transmit mode of operation. However, in a receive mode of operation, on-chip transmit/receive processing module 216 couples antenna 220 to low noise amplifier 228 which produces an ingoing RF signal, which has been slightly amplified, to digital signal and RF processing 204, for further processing.

One aspect of the active power meter 212 of integrated circuit radio transceiver 200 is that active power meter 212 is operable to produce an accurate indication of the forward output power without substantially affecting the output current level and, therefore, output power level. Moreover, as will be described in greater detail below, active power meter 212 is further operable to produce an accurate representation of a forward output power.

Other aspects of the embodiments of the invention to observe include the overall design in which the power amplifier 208, the active power meter 212, and the transmit/receive switch 216 are all formed on-chip and are part of the integrated circuit radio transceiver 200. In prior art radio transceiver designs, the power amplifier 208, the forward output power sensing circuitry, and the transmit/receive switching circuitry, are formed off-chip because of sizing and performance considerations. For example, many prior art power amplifiers generate substantial heat and require designs that exceed the limitations of very small on-chip devices. Similarly, prior art forward output power sensing systems often implement designs that require large and bulky couplers which are too large to be formed on-chip. Along the same lines, many prior art transmit/receive switching circuits are formed off-chip simply because the breakdown voltages of the on-chip devices are too low to satisfy the requirements of a typical transmit/receive switching circuitry design. In the present embodiments of the invention, however, each of these elements, namely the power amplifier, the active power meter, and the transmit/receive switching circuitry, are all formed on-chip as will be described in greater detail below.

Figure 5:
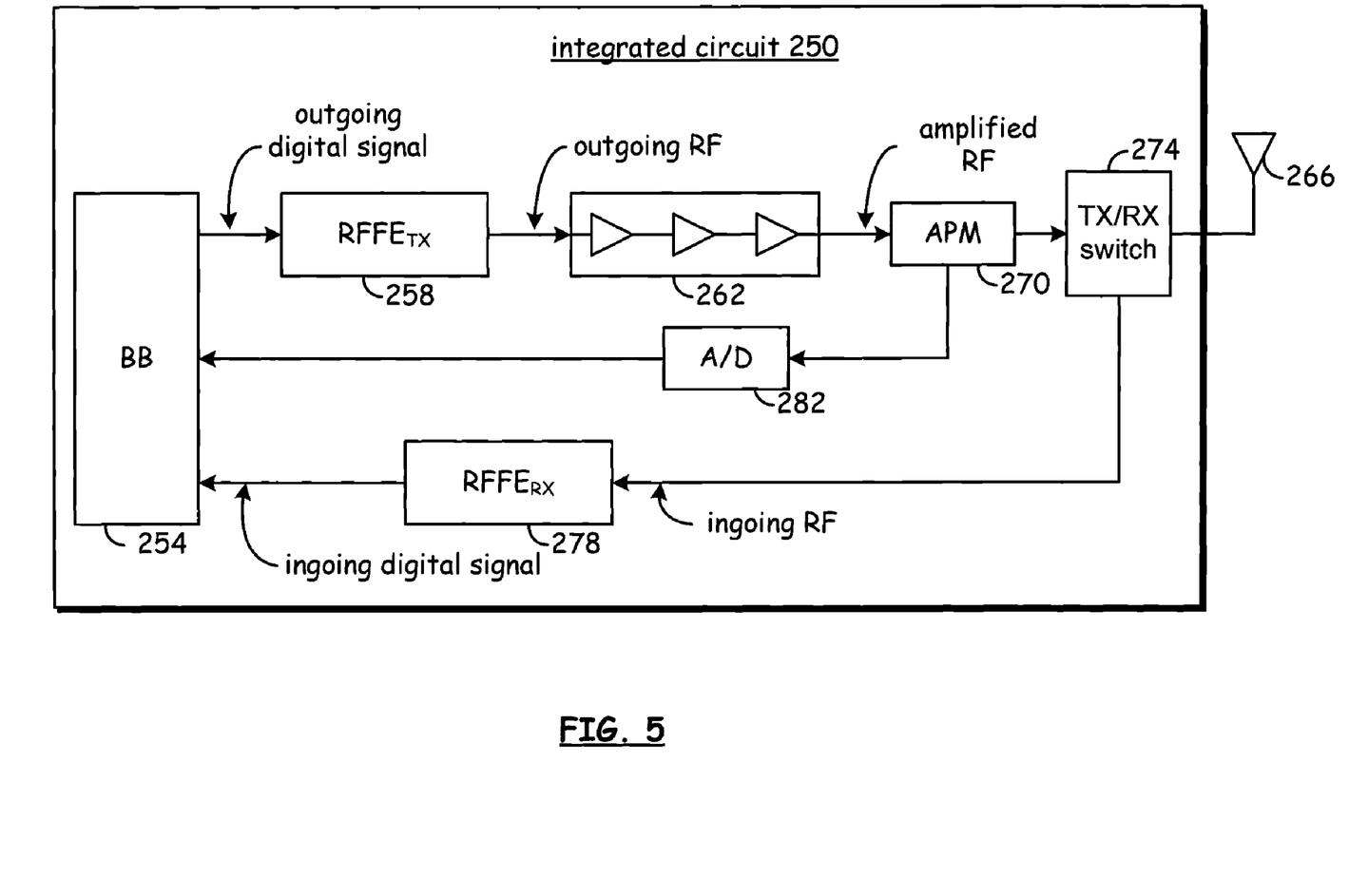
FIG. 5 is a functional block diagram of an integrated circuit radio transceiver comprising a directional coupler according to one embodiment of the invention.

FIG. 5 is a functional block diagram of an integrated circuit radio transceiver comprising a directional coupler according to one embodiment of the invention. As may be seen, integrated circuit 250 includes a baseband processor 254 that produces outgoing digital signals to transmit radio frequency front end 258 which is operable to generate outgoing radio frequency signals (RF) based upon the outgoing digital signals. The outgoing RF is then produced to power amplifier 262 that produces an amplified RF to antenna 266 over outgoing active power meter 270 and by way of a transmit/receive switch 274.

Further, ingoing RF received at antenna 266 is produced to receive front end 278 (by way of switch 274) that is operable to produce an ingoing digital signal to baseband processor 254 for processing based upon the ingoing RF. It should be understood that other known radio elements are not shown here but may be included. For example, low noise amplification circuitry to amplify the ingoing RF may be part of receive front end 278 or may be operably disposed between antenna 266 and receive front end 278.

In operation, power amplifier 262 produces amplified RF which is conducted through active power meter 270 and transmit/receive switch 274 to antenna 266. Active power meter 266 is operable to consume an insignificant amount of power in the process of generating a signal that accurately reflects the forward output power. In the described embodiment, the signal is produced to an analog to digital converter 282 that produces a digital representation of the forward output power to baseband processor 254.

Figure 6:
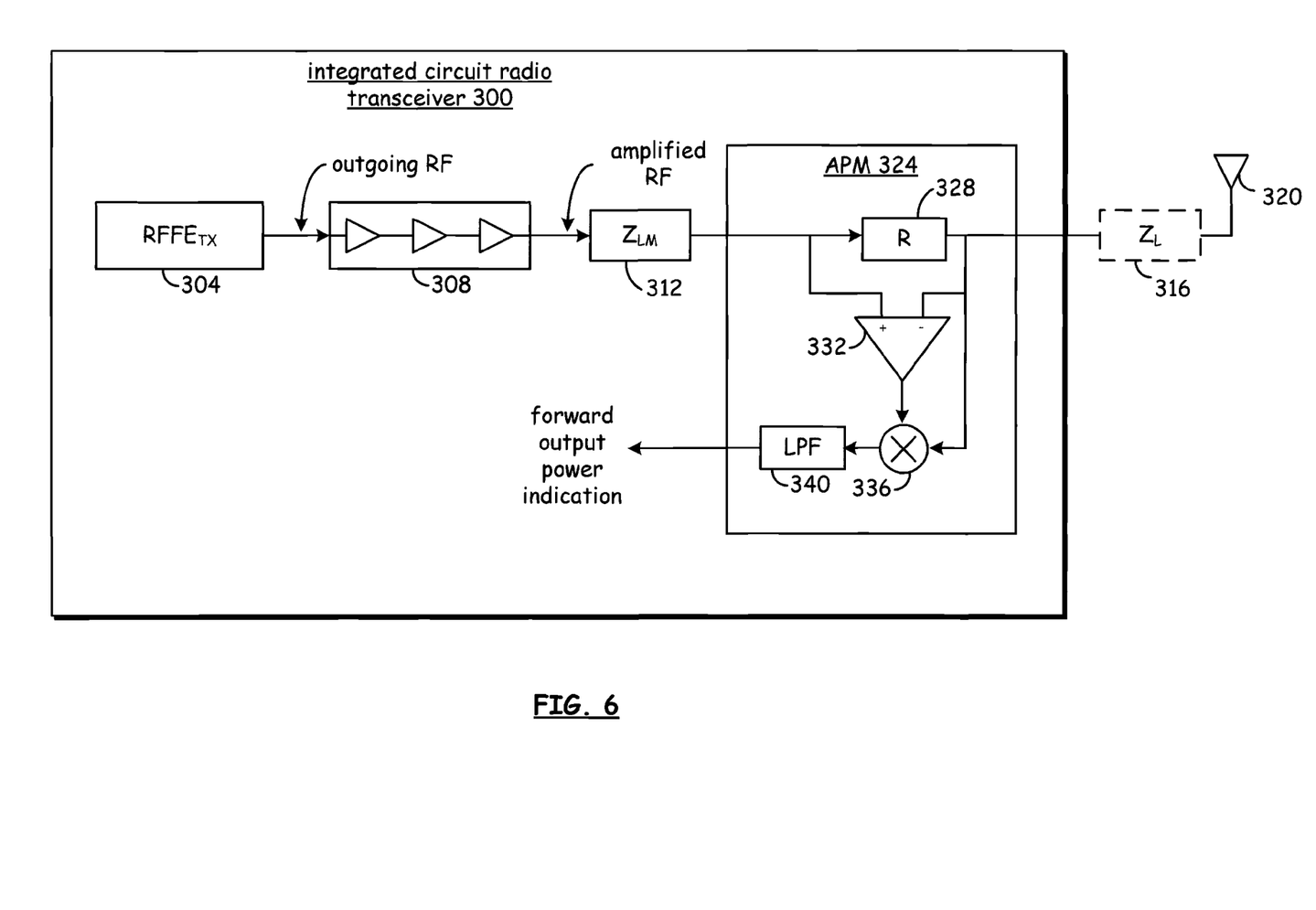
FIG. 6 is a functional block diagram of an integrated circuit radio transceiver 300 according to one embodiment of the present invention.

FIG. 6 is a functional block diagram of an integrated circuit radio transceiver 300 according to one embodiment of the present invention. As may be seen, integrated circuit radio transceiver 300 includes a radio frequency front end transmit processing block 304 which produces an outgoing RF signal to power amplifier 308. As may be seen, power amplifier 308 is a three-stage amplifier though other designs for power amplifiers may be used. Power amplifier 308 produces an amplified RF to an output impedance load matching module 312. Output impedance load matching module 312 then produces the amplified RF to active power meter 324. One of average skill in the art readily understands that the inclusion of output impedance load matching module 312 operably matches the output impedance 316 of antenna 320 and is beneficial for efficiently delivering power to antenna 320 for electromagnetic radiation of an outgoing radio frequency signal.

Active power meter 324, which is operably disposed to receive the amplified RF from output impedance load matching 312 is operable to produce a forward output power indication without substantially reducing or consuming any of the power of the amplified RF. More specifically, the amplified RF is received by a resistive module 328 and is conducted through the resistive module 328 and is produced to antennal 320. Coupled across resistive module 328 is an active comparison circuit 332 (i.e., a comparator) that is operable to sense an input voltage level to resistive module 328 and an output voltage level of resistive module 328 and to produce a difference which indicates the voltage drop across resistive module 328.

In the described embodiment of the invention, comparator 332 produces the voltage drop indication to a first input of a multiplier 336. A second input of multiplier 336 is operably coupled to sense or receive the output voltage level of the amplified RF signal which is produced to antenna 320. Thus, multiplier 336 is operable to multiply the output voltage level against the voltage drop across the resistive module 328. The output of multiplier 336 is then produced to a low pass filter 340 that low pass filters the output of multiplier 336 to produce the forward output power indication.

In the described embodiment of the invention, the resistive module 328 comprises a resistive element that provides a precise resistance value equal to 1 Ohm. Because voltage is equal to the product of Current×Resistance, the voltage drop across resistive module 328 is also equal to the Current×the Resistance. However, because the resistance is a precise 1 Ohm value, the voltage drop across resistive module 328 also is equal to the current conducted there through. Accordingly, since this voltage drop across resistive module 328 is equal to a current, comparator 332 produces an indication of the current conducted through the resistive module 328. Thus, multiplier 336 is effectively receiving a current indication at the first input and a voltage indication at the second input is therefore operable to produce a power indication since power is equal to the product of Voltage×Current.

By using a precise 1 Ohm resistive element, detected voltage drops and voltage levels within the active power meter circuitry allow for a simple calculation of forward output power. The resistive module 328 may comprise a traditional resistor, or any other element that is operable as a resistive element. For example, resistive module 328 may comprise a MOSFET device configured and biased to operate as a precise resistive element. Further, the resistive value of resistive module 328 may be other values that are less than or greater than one ohm. Generally, any value other than one ohm may be compensated for by amplification or mathematically by down stream logic or circuitry, respectively.

Figure 7:
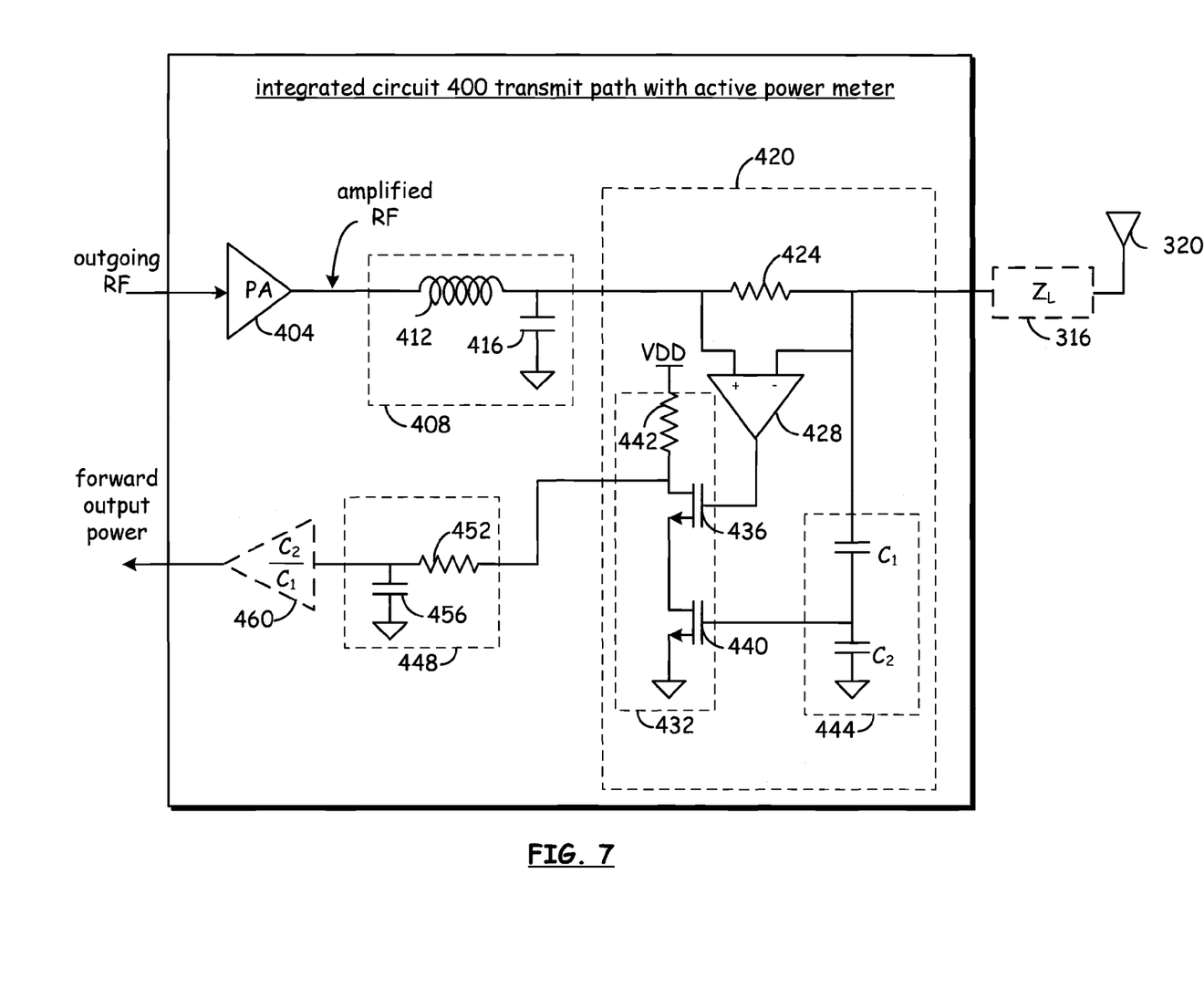
FIG. 7 is a functional schematic diagram of an integrated circuit transmit path module with an active power meter according to one embodiment of the present invention.

FIG. 7 is a functional schematic diagram of an integrated circuit transmit path module with an active power meter according to one embodiment of the present invention. An integrated circuit 400 transmit path with active power meter is operably disposed to receive an outgoing RF. More specifically, the outgoing RF is received by a power amplifier 404 that produces an amplified RF to an impedance load matching module 408. Impedance load matching module 408, in the described embodiment, includes an inductive element 412 coupled to a capacitive element 416 which, at a desired frequency of interest, produces an impedance to match an output impedance 316 of antenna 320. Capacitive element 416, as well as the other capacitive elements shown in FIG. 7, may be formed either with traditional capacitors or with semiconductor devices that are operably disposed and biased to operate as capacitive elements. For example, capacitor 416 may comprise a capacitor-configured MOSFET.

The output of impedance load matching module 408 is then produced to active power meter 420. Specifically, the amplified RF that is conducted through impedance load matching module 408 is produced to resistor 424 through which the amplified RF is conducted to antenna 320. A comparator 428 is coupled across resistor 424 and is operably disposed to sense the voltage drop across resistor 424. As described in relation to FIG. 6, resistor 424 is a precise 1 Ohm resistor. Accordingly, while the output of comparator 428 technically is a difference in the input voltage and output voltage of resistor 424, the output of comparator 428 also reflects the current conducted through resistor 424 since the resistive value of resistor 424 is equal to 1 Ohm.

The output of comparator 428 is produced to a first input of multiplier 432. As may be seen, a first input of multiplier 432 is the gate of a MOSFET 436. The drain of MOSFET 436 is coupled to a supply by way of resistor 442 while the source terminal of MOSFET 436 is coupled to the output of multiplier 432 and to the drain of a second MOSFET 440. The gate of MOSFET 440 comprises the second input of multiplier 432. A source terminal of MOSFET 440 is coupled to circuit common or ground. As may further be seen, the output of resistor 424 is not only coupled to a negative input terminal of comparator 428, but also to the second input of multiplier 432, namely the gate terminal of MOSFET 440, by way of a signal divider 444.

Signal divider 444 comprises two capacitive elements $C_1$ and $C_2$ which are operable to divide an output signal magnitude by a specified factor. In the described embodiment, a ratio of $C_1:C_2$ is equal to 1:10. As such, signal divider 444 is operable to conduct only 10% of the output signal magnitude of resistive element 424 into the gate of MOSFET 440 for multiplication with the output of comparator 428. In the described embodiment of the invention, the output of multiplier 432 is therefore produced to low pass filter 448. Low pass filter 448, in the described embodiment, comprises a resistor 452 and a capacitor 456. In one embodiment of the invention, the resistor is a 1 kilo Ohm resistor and the capacitor is reasonably large and has a capacitance of 10 picofarads. The low pass filter output of low pass filter 448 is then produced to an optional amplifier 460 which amplifies the power indication by an amount to compensate for and that is opposite of the radio of the signal divider 444. For example, in one embodiment, the ratio of $C_1:C_2$ is equal to 1:10. Accordingly, optional amplifier 460 is included to amplify the output power indication by a factor of $C_2:C_1$, which in the described embodiment, is equal to 10. As such, the amplified output of amplifier 460 reflects the actual forward output power being produced by power amplifier 404 of integrated circuit 400.

It should be understood, of course, the amplifier 460 is optional. The output of low pass filter 448 may merely be mathematically amplified by processing logic within a downstream processor to determine the actual power level. As may be seen, multiplier 432 generally comprises a Gilbert cell multiplier circuit whose output is the product of the two input signals received at the gates of MOSFETs 436 and 440.

Generally, a forward output power going to the antenna is described by $$\text{average forward power} = \text{average}\,(\tfrac{1}{2} \times (V_o \times I \times \cos(a))) \quad (1)$$

In equation (1) above, $V_o$ is a peak voltage magnitude across a load Z and I is the peak of the current passing through the load Z and (a) is a phase difference between the voltage and current. Voltage $V_o$ is measured by a simple peak detector and the current I is measured by measuring the voltage across the resistive element wherein $$I = (V_o - V_i)/R \quad (2)$$

However, because R=1, the current is merely equal to the voltage drop across the resistor. Thus, the forward output power may be measured by multiplying the voltage drop across the resistive element and the output power.

Assuming that the current and voltage are continuous wave signals, W is the frequency and (a) is a phase difference between the voltage and current, $$v_o = V_o \times (Wt) \quad (3)$$

$$i = I \times (Wt + a) \quad (4)$$

The output of a simple multiplier circuit, for example, a Gilbert cell, therefore is a multiplication of $v_0$ and i. As such, $$PF = \tfrac{1}{2} \times (V_0 \times I \times (\cos(a) + \cos(2Wt + a))) \quad (5)$$

The signal at the output of the low pass filter is therefore equal to the output power $$PF = \tfrac{1}{2} \times (V_0 \times I \times (\cos(a))) \quad (6)$$

which is, therefore, the forward output power going to the load Z which, in this case, is the antenna used to radiate the outgoing RF signal.

Figure 8:
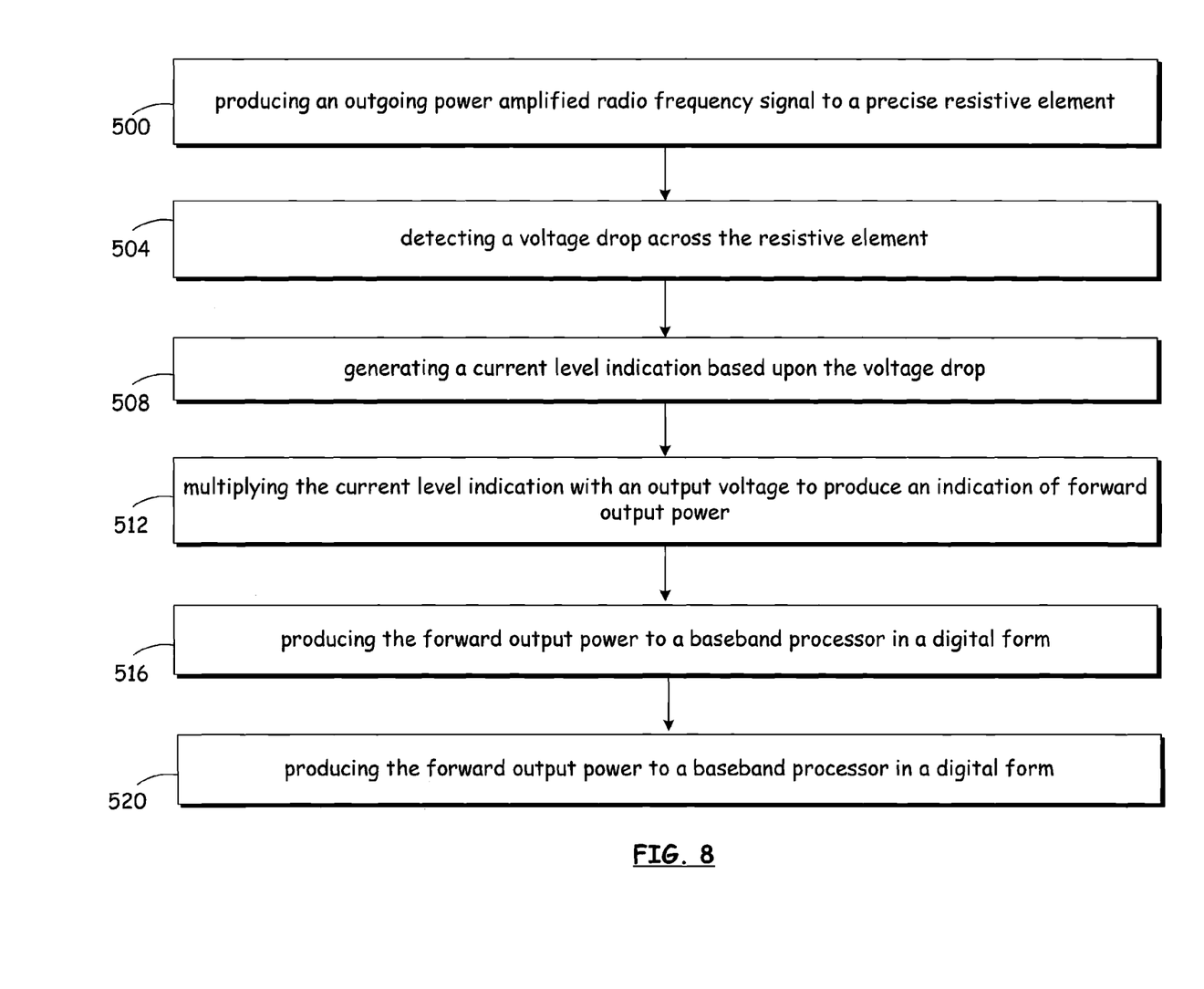
FIG. 8 is a flow chart that illustrates operation of the various embodiments of the present invention.

FIG. 8 is a flow chart that illustrates operation of the various embodiments of the present invention. A method for detecting forward output power generally includes producing an outgoing power amplified radio frequency signal to a precise resistive element (step 500). As described before, the precise resistive element has a resistive value equal to 1 ohm and may be either a traditional resistor or a resistor configured MOSFET. Also, for this and the prior described embodiment other low values of resistance may be used (e.g., 2-4 ohms). Generally, a resistance that is less than or greater than one may be used, but the resistance should be substantially less than an impedance magnitude of an antenna may be used. Because other values of resistance are being used, in such an embodiment, however, compensation may desirably be provided either mathematically in processing logic or with an amplifier to provide a reading that reflects the forward output power. The larger issue with using higher levels of resistance, however, is that the amount of power consumed by the active power meter increases with the increase in resistance.

Thereafter, the method includes detecting a voltage drop across the resistive element (step 504) and generating a current level indication based upon the voltage drop (step 508). IN the described embodiments, these steps are performed by an active comparator circuit. The method further includes multiplying the current level indication with an output voltage to produce an indication of forward output power (step 512). In one embodiment, the indication of the forward output power is then low pass filtered to remove high frequency components (step 516). Finally, the method includes producing the forward output power to a baseband processor in a digital form (step 520).

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. An integrated circuit radio transceiver, comprising:
   baseband processor for processing ingoing and outgoing digital communication signals;
   transmitter front end for processing and transmitting outgoing RF signals based upon the outgoing digital communication signals, the transmitter front end including a power amplifier for increasing a forward output power level;
   receiver front end for receiving ingoing RF signals and for processing the ingoing RF signals to produce the ingoing digital communication signals;
   a power meter formed on chip with the transmitter and receiver front ends, which power meter is operably disposed to sense the forward output power level;
   a multiplier operable to multiply an output voltage level against a voltage drop across a sensing element, wherein an output of the multiplier is produced to a low pass filter to produce a forward output power indication; and
   an antenna for transmitting and receiving radio frequency signals.

2. The integrated circuit radio transceiver of claim 1 wherein the sensing element of the power meter is in series within a transmit path and down stream of a power amplifier wherein a voltage drop across the sensing element corresponds to a forward output power.

3. The integrated circuit radio transceiver of claim 1 further including a comparator coupled across the sensing element.

4. The integrated circuit radio transceiver of claim 3 wherein the sensing element is a resistive element.

5. The integrated circuit radio transceiver of claim 4 wherein the resistive element is characterized by a low resistance value.

6. The integrated circuit radio transceiver of claim 5 wherein the low resistance value is less than or equal to one ohm.

7. The integrated circuit radio transceiver of claim 6 wherein the resistance value is a precise value within a specified tolerance.

8. The integrated circuit radio transceiver of claim 3 wherein the comparator is coupled to sense the voltage at the input and the output of the sensing element to provide an output that corresponds to a difference in the input and output voltages.

9. The integrated circuit radio transceiver of claim 8 further including a multiplier operably coupled to receive the comparator output and the output voltage of the sensing element.

10. The integrated circuit radio transceiver of claim 9 wherein a magnitude of an output of the multiplier reflects a forward output power.

11. The integrated circuit radio transceiver of claim 1, wherein the outgoing RF signal and ingoing RF signal conform to at least one cellular communication standard.

12. An integrated circuit radio transceiver, comprising:
   a transmit front end module operable to produce an outgoing RF signal;
   a receive front end module operable to receive and process an ingoing RF signal;
   means for generating a transmit path current level indication;
   means for multiplying an output voltage level against a voltage drop across a resistive element, wherein an output of the multiplier is produced to a low pass filter to produce an output power level indication; and
   means for producing the output power level indication based upon the current level indication and an output voltage.

13. The integrated circuit radio transceiver of claim 12 wherein the means for generating a transmit path current level indication further includes a high precision resistive element having a resistance equal to one ohm.

14. The integrated circuit radio transceiver of claim 12 wherein the means for generating a transmit path current level indication further includes a comparator operable to detect a voltage drop across the resistive element.

15. The integrated circuit radio transceiver of claim 12 wherein the means for producing an output power level indication further includes a multiplication circuit operable to produce a product of the current level indication and output voltage.

16. The integrated circuit radio transceiver of claim 15 wherein the multiplication circuit comprises a Gilbert mixer.

17. The integrated circuit radio transceiver of claim 15 further including a low pass filter operable to remove high frequency components of the product produced by the multiplication circuit.

18. The integrated circuit radio transceiver of claim 12, wherein the outgoing RF signal and ingoing RF signal conform to at least one cellular communication standard.

19. A method for operating an integrated circuit radio to detect forward output power comprising:
   producing an outgoing RF signal;
   receiving and processing an ingoing RF signal;
   generating a transmit path current level indication;
   multiplying an output voltage level against a voltage drop across a resistive element, wherein multiplying produces an output to a low pass filter to produce an output power level indication; and
   producing the output power level indication based upon the transmit path current level indication.

20. The method of claim 19, wherein producing the output power level indication based upon the transmit path current level indication comprises:
   generating a current level indication based upon the voltage drop; and
   multiplying the current level indication with an output voltage to produce the output power level indication.

21. The method of claim 19 further comprising low pass filtering the indication of forward output power to remove high frequency components.

22. The method of claim 19 wherein the high precision resistive element has a resistance that is equal to or less than one ohm.

23. The method of claim 19 wherein the high precision resistive element has a resistance that is greater than one but substantially less than an impedance magnitude of an antenna, wherein the method further comprises multiplying one of the current level indication or the forward output power level by a factor that is equal to the resistance of the resistive element.

24. The method of claim 19, wherein the high precision resistive element has a resistive value substantially equal to one ohm and wherein the output of the comparator is an indication of a current conducted through the precise resistor.

25. The method of claim 19, further comprising producing the output power level indication as a product of the current indication multiplied with an output voltage.

26. The method of claim 19, wherein the outgoing RF signal and ingoing RF signal conform to at least one cellular communication standard.

* * * * *